United States Patent [19]
Gupta

[11] Patent Number: 5,324,474
[45] Date of Patent: Jun. 28, 1994

[54] METHOD OF MAKING A PRINTED WIRING BOARD SPACER

[75] Inventor: Gyanendra Gupta, Plano, Tex.

[73] Assignee: Texas Instruments Incorporated, Dallas, Tex.

[21] Appl. No.: 63,834

[22] Filed: May 20, 1993

Related U.S. Application Data

[63] Continuation of Ser. No. 780,684, Oct. 18, 1991, abandoned.

[51] Int. Cl.$^5$ ............................................. B29C 45/00
[52] U.S. Cl. .............................. 264/328.1; 264/328.8; 264/331.15; 264/349; 264/28; 264/317; 29/832
[58] Field of Search ................. 29/739, 832; 264/245, 264/278, 272.15, 328.1, 328.9, 331.15, 328.8, 349.28, 317

[56] References Cited

U.S. PATENT DOCUMENTS

| | | | |
|---|---|---|---|
| 3,154,201 | 10/1964 | Frank | 29/832 |
| 3,634,571 | 1/1972 | Klepp et al. | 264/272.15 |
| 4,606,120 | 8/1986 | McAndrew | 29/739 |
| 4,814,295 | 3/1989 | Mehta | 29/832 |
| 4,953,061 | 8/1990 | Nitkiewicz | 29/832 |
| 5,037,309 | 8/1991 | Abe et al. | 29/832 |

*Primary Examiner*—Jeffery Thurlow
*Assistant Examiner*—Mathieu Vargot
*Attorney, Agent, or Firm*—René E. Grossman; Richard L. Donaldson

[57] ABSTRACT

Thermoplastic printed wiring board spacers are fabricated by providing a water soluble partially hydrolyzed polyvinyl alcohol resin or fully hydrolyzed polyvinyl alcohol resin or a blend of partially hydrolyzed polyvinyl alcohol resin and fully hydrolyzed polyvinyl alcohol resin, the ration thereof depending upon (1) the degree of hydrolyzation of the polyvinyl alcohol resins, (2) crystallinity associated with particular polyvinyl alcohol resins, (3) the fabrication temperatures of the printed wiring board to avoid spacer melting and (4) the degree of solubility in water of the spacer. The spacers are fabricated by injection molding the polyvinyl alcohol resins or desired polyvinyl alcohol resin mixture to provide a molded configuration having a runner system with spacers attached to a sub runner system by a very thin gate. The spacers are removed from the molded configuration by initially cooling the surface of the total molded configuration to a temperature at which the thin gate sections becomes very brittle. The cooled molded configuration is then subjected to tumbling or a jolt whereby the spacers break away from the runner system at the gates.

7 Claims, 2 Drawing Sheets

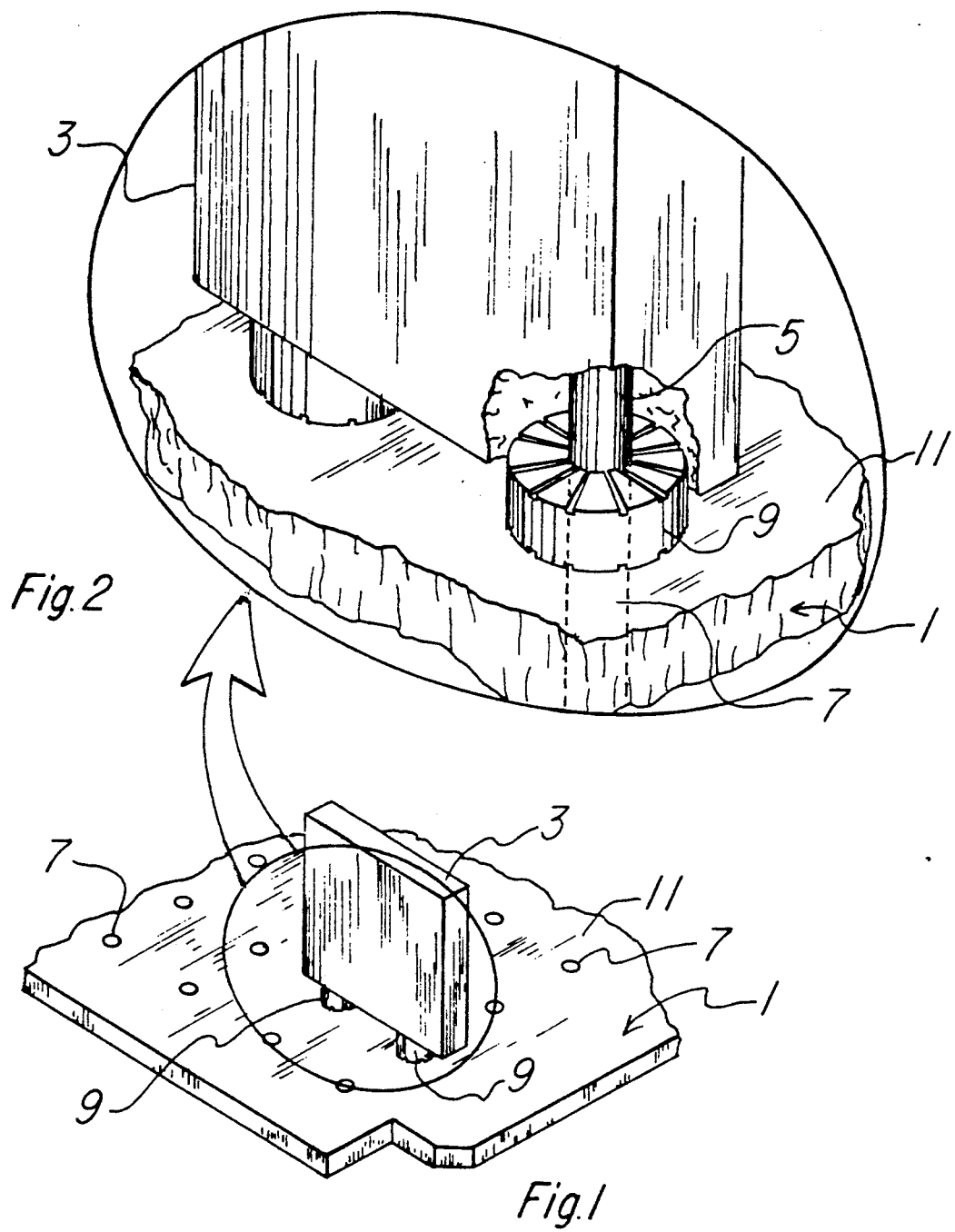

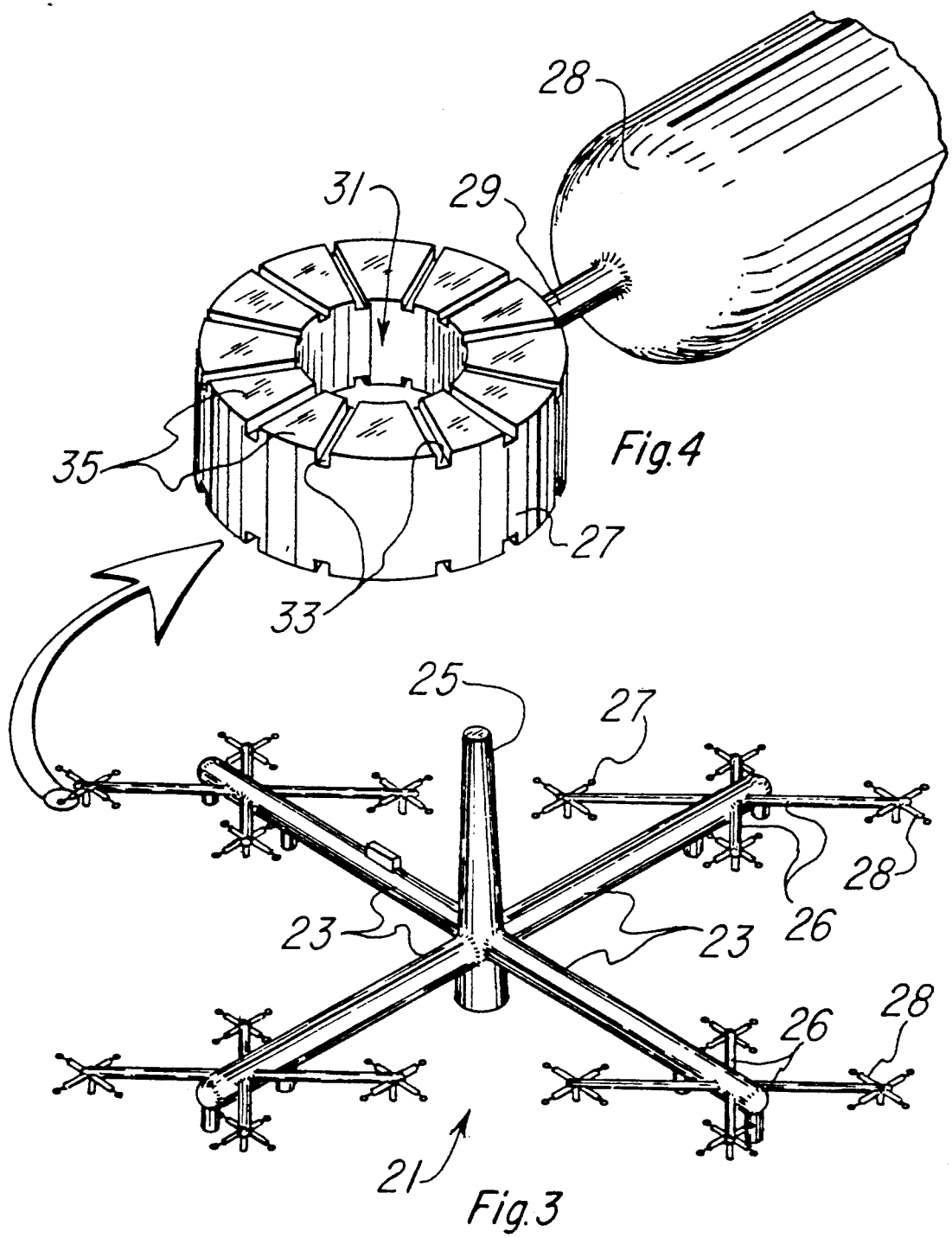

METHOD OF MAKING A PRINTED WIRING BOARD SPACER

This application is a continuation of application Ser. No. 07/780,684, filed Oct. 18, 1991, now abandoned.

BACKGROUND OF THE INVENTION

1. Field of the Invention

This invention relates to water soluble printed wiring board (PWB) spacers and more specifically to water soluble PWB spacers of thermoplastic materials which can be mass produced using one of the melt processable techniques applicable to thermoplastics such as injection molding.

2. Brief Description of the Prior Art

Mounts and spacers are often required to provide spacing for the electronic components at various elevations above PWBs. The purpose of these mounts and spacers is as follows:

(1) Provide adequate air space and lead length for heat dissipation to prevent operational overheating.

(2) Ability to clean under parts. Cleanability is an important design concern. Sufficient spacing between the part and the board will ensure that the cleaning solvent or aqueous cleaner can flow under the part and prevent entrapment of contaminants. As greater lead numbers and finer lead pitches are used, it becomes harder to force the cleaning solvents under the part.

(3) Provide mechanical protection. Eliminate lead stresses and improve shock and vibration characteristics.

(4) Simplify assembly, touch-up and repair work accessibility to leads for inspection.

The most common technique currently used to provide component spacing on the PWBs is with the use of mounts and spacers, produced from thermoplastics such as nylon. These mounts and spacers however become permanent to the printed wiring board assembly. The disadvantages include added cost of permanent mounts and spacers.

An optional technique used for elevating electronic components of the printed wiring board is by placing a slight twist on the leads of electronic components. This method, commonly referred to as jog form, is labor intensive and is applicable to less than 30% of applications. This method also promotes leaning over of components which in turn leads to printed wiring board rework and/or scrap.

The most pertinent prior art of which applicant herein is aware involves wash away spacers compounded of organic material (lactose) for spacing electronic components on printed wiring boards. The manufacturing technique of these spacers is unknown. Prior to flow/wave solder processing, the wash away spacers of various shapes and desired thickness are placed between electronic components and the printed wiring board to raise the electronic component height to a desired elevation. Most often the leads of the electronic components pass through the spacers inside diameter and finally through printed wiring board to keep spacer intact between the electronic component and the printed wiring board during flow solder process. The spacers can also be placed between electronic components and printed wiring board without leads passing therethrough to provide desired spacing between electronic components and the printed wiring board. These techniques can be expensive since lactose spacers are brittle, difficult to handle and can prematurely break before or during flow solder processing, creating massive rework and scrap of printed wiring boards.

SUMMARY OF THE INVENTION

In accordance with the present invention, the above noted problems of the prior art are eliminated and there is provided a relatively inexpensive to produce PWB spacer which is not brittle and subject to breakage, retains its shape at the PWB fabrication and soldering temperatures encountered, yet is water soluble and easily removed from the completed PWB.

Briefly, the desired water soluble thermoplastic PWB spacers are molded by using partially (approximately 88%) hydrolyzed polyvinyl alcohol resins with a melting range between 120°–200° C. and exhibit up to 24% crystallinity or by using fully (approximately 98%) hydrolyzed polyvinyl alcohol resins with a melting range between 150° C.–230° C. which exhibit up to 45% crystallinity. The partially hydrolyzed polyvinyl alcohol resins are cold water soluble, whereas fully hydrolyzed polyvinyl alcohol resins are cold water insoluble.

Alternatively, a blend of the partially hydrolyzed polyvinyl alcohol resins and the fully hydrolyzed polyvinyl alcohol resins mentioned above can be used to alter the properties of the PWB spacers used in various applications. The ratio of the partially hydrolyzed polyvinyl alcohol resin to the fully hydrolyzed polyvinyl alcohol resin depends upon following factors:

1. The various temperatures involved during fabrication of the PWB to avoid premature melting of the spacers.

2. The degree of solubility in water required for the spacer.

A preferred source of partially hydrolyzed polyvinyl alcohol resin is 2000 series and 5000 series VINEX TM thermoplastic polyvinyl alcohol copolymer resins manufactured by Air Products and Chemicals, Inc., Polymer Chemicals Division, Allentown, Pa. 18195 U.S.A.

A preferred source of fully hydrolyzed polyvinyl alcohol resin is 1000 series VINEX TM thermoplastic polyvinyl alcohol copolymer resins manufactured by Air Products and Chemicals, Inc., Polymer Chemicals Division, Allentown, Pa. 18195 U.S.A.

The spacers in accordance with the present invention are preferably fabricated by injection molding. The desired polyvinyl alcohol resin or a blend described above is used to provide a molded configuration described hereinbelow. Each spacer is attached to the runner system with a tab or an edge gate.

The spacers are degated from the runner system by initially cooling the surface of the total runner system with parts attached to a temperature at which the gates become brittle. This is accomplished, for example, by spraying liquid nitrogen over the surface of the entire runner system, whereby the thin gate sections reach essentially the temperature of the liquid nitrogen entirely therethrough and become very brittle. Tumbling of the runner system while liquid nitrogen is being sprayed thereon or immediately thereafter, causes parts to degate from the remainder of the runner system, breaking away at brittled thin gate sections. Parts can then be easily separated from the remaining runner system by using a wide mesh sieve which traps the runner system at the top thereof. Parts are collected into a container at the bottom of the sieve and placed into an oven at about 170° F. for 15–30 minutes and slowly heated up to room temperature to prevent any condensation of moisture on the just degated spacers using liquid nitrogen technique.

As an alternate degating technique, the spacers can be automatically degated during molding operation by utilizing a subgate (tunnel gate).

In either technique the remainder of the runner system after degating the part can be pelletized and recycled into the molding process.

As an alternate embodiment, the spacers as molded can include ridges therein along one or preferably on both opposing surfaces. These ridges perform three functions as follows:

1. When in place around component leads, gases emitted during the soldering process will have an avenue of escape through the recessed area between the ridges. This prevents and minimizes rejects due to solder defects in the finished printed wiring board assembly.
2. The ridges and recessed surfaces provide for increased exposed surface area, which helps prevent premature melting of the spacer by keeping it cool during flow/wave solder process. This prevents or minimizes rejects due to the components dropping down below acceptable limit in the finished printed wiring board assembly.
3. Greater surface area available to the water solvent during rinse and water wash step results in more rapid dissolving of the spacer material. This helps in faster removal of the spacer from the printed wiring board assembly, and accounts for fabrication process to be cost effective.

BRIEF DESCRIPTION OF THE DRAWINGS

FIG. 1 is a perspective view of a printed wiring board having a component mounted thereon with a spacer between the component and the board;

FIG. 2 is an enlarged view of a portion of FIG. 1;

FIG. 3 is a perspective view of a molded configuration containing the PWB spacers of the present invention as a portion thereof; and FIG. 4 is an enlarged view of a portion of FIG. 3.

DESCRIPTION OF THE PREFERRED EMBODIMENTS

Referring first to FIGS. 1 and 2, there is shown a printed wiring board 1 having a component 3, such as, for example, a resistor, capacitor, semiconductor, etc., having a lead 5 extending through an aperture 7 in the board with a spacer 9 disposed between the board surface 11 and the component 3 to maintain the component 3 spaced from the board surface 11 by the height of the spacer. (It should be understood that the spacer need not be apertured and merely need be positioned between the component 3 and the board 1 to provide the desired component spacing.) During fabrication of the PWB, the spacer 9 is placed around the lead 5 and the lead 5 is placed through the aperture 7 in the PWB so that the spacer is disposed between the surface 11 of the PWB and the component 3 as shown. It is understood that a typical PWB will generally have many such components 3 and apertures 7. Between standard pre-soldering and post-soldering steps, the PWB with components therein is passed through a soldering step, such as, for example, wave soldering, in standard manner to solder the lead 5 in the aperture 7. Any portion of the lead 5 extending below the PWB will then be severed and the PWB will then appear as shown in FIGS. 1 and 2. The PWB of FIGS. 1 and 2 is then passed through the water wash step to dissolve the spacer 9 in water to provide a final PWB with components 3 mounted thereon and spaced from the PWB surface as required.

The PWB spacer of FIGS. 1 and 2 is fabricated by first determining the temperatures to be encountered during the PWB fabrication process and determining the maximum amount of time available for dissolving the spacer in water at the end portion of the PWB fabrication process. From this data, and from the available data for the particular partially hydrolyzed and fully hydrolyzed polyvinyl alcohol resin, a tradeoff is made to use a resin or the ratio of each be used to concomitantly provide the desired spacer melting temperature and water solubility rates.

EXAMPLE 900 grams of partially (approximately 88%) hydrolyzed polyvinyl alcohol resin and 100 grams of fully (approximately 98%) hydrolyzed polyvinyl alcohol resin pellets were weighed and dry blended together in the form of a salt and pepper mix.

Resin drying is recommended at 170° F. for 2–4 hours. This can be accomplished in a fan forced convection oven or dehumidifying hopper dryer. The resin can be dried prior to mixing or after mixing as a dry blend.

The resin or the desired blend ratio is fed into the hopper of the standard thermoplastic injection molding machine. Some process optimization is required for each different blend ratio.

The molded configuration 21 is illustrated in FIG. 3. Sprue 25, runner system 23 and sub-runner system 26 and 28 are shown. The donut shaped spacers (shown enlarged in FIG. 4) are molded in this example using a tab gate 29.

The spacers 27 are degated from the sub-runner system 28 by initially cooling the surface of the entire molded configuration 21 to a temperature at which the gates 29 become brittle. This is accomplished, for example, by spraying liquid nitrogen over the surface of the entire molded configuration 21, whereby the thin gate 29 sections reaches essentially the temperature of the liquid nitrogen entirely therethrough and becomes very brittle. Tumbling the entire molded configuration 21 or sections of runner system 23 while liquid nitrogen is being sprayed or immediately thereafter, causes parts to degate from the sub-runner system 28, breaking away at brittled thin gate sections. Spacers 27 can then be easily separated from the remaining molded configuration 21 by using a wide mesh sieve, which traps the waste at the top. Spacers 27 are collected in a container at the bottom and placed into an oven at 170° F. for 15–30 minutes and slowly allowed to cool down to a room temperature to prevent any condensation of moisture on the just degated spacers 27 using liquid nitrogen as the degating technique.

As an alternate degating technique, the spacers 27 can be automatically degated during the molding operation by utilizing a sub-gate (tunnel gate).

In either technique the remainder of the molded configuration 21, including sprue 25 runner system 23 and sub-runner system 26 and 28 can be pelletized and recycled into the molding process.

With reference now to FIG. 4, while the spacer 27 can have a flat continuous outer surface as a first embodiment which is not shown, there is shown a second embodiment of a donut-shaped spacer in accordance with the present invention. This spacer is fabricated in the same manner as described above with reference to the spacer described in connection therewith. The difference herein is that the spacer 27 includes a central aperture 31 with ridges 35 on at least one surface thereof and preferably both opposite surfaces thereof and recessed surfaces 33 between the ridges. It can be seen that the spacer 27, when resting on the surface 11 of the PWB 1 of FIGS. 1 and 2, will have ridges 35 extending along the recessed surfaces 33 whereby gases emanating from the aperture 7 can travel through such recessed surfaces 33 to the exterior environment. In addition, since the exposed surface area of the spacer 27 is increased relative to the surface area of a spacer 27 without the ridges 35 and recessed surfaces 33, the spacer 27 will dissolve in water at a greater rate than will the spacer without ridges 35, thereby speeding up the fabrication process.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

I claim:

1. A method of making a printed wiring board spacer which is removable by dissolution in a liquid subsequent to board fabrication which comprises the steps of:
    (a) providing a water soluble blend of partially hydrolyzed polyvinyl alcohol resin and fully hydrolyzed polyvinyl alcohol resin in a predetermined ratio; and
    (b) molding said blend into a solid printed wiring board spacer;
    (c) the ratio of partially hydrolyzed polyvinyl alcohol to fully hydrolyzed polyvinyl alcohol being determined to provide a predetermined spacer melting temperature.

2. A method of making a printed wiring board spacer which is removable by dissolution in a liquid subsequent to board fabrication which comprises the steps of:
    (a) providing a water soluble blend of partially hydrolyzed polyvinyl alcohol resin and fully hydrolyzed polyvinyl alcohol resin in a predetermined ratio; and
    (b) molding said blend into a solid printed wiring board spacer;
    (c) the ratio of partially hydrolyzed polyvinyl alcohol to fully hydrolyzed polyvinyl alcohol being determined to provide a predetermined solubility rate of said spacer is water.

3. The method of claim 1 wherein the ratio of partially hydrolyzed polyvinyl alcohol resin to fully hydrolyzed polyvinyl alcohol resin is determined to provide a predetermined solubility rate of said spacer in water.

4. A method of making a printed wiring board spacer which is removable by dissolution in a liquid subsequent to board fabrication which comprises the steps of:
    (a) providing a water soluble blend of partially hydrolyzed polyvinyl alcohol resin and fully hydrolyzed polyvinyl alcohol resin in a predetermined ratio capable of being molded into a solid, mechanically stable, water soluble form; and
    (b) molding said blend into a solid, mechanically stable, water soluble printed wiring board spacer;
    (c) said partially hydrolyzed polyvinyl alcohol resin being water soluble and moldable and being about 88% hydrolyzed with a melting range between 120° C. and 200° C. and exhibiting up to 24% crystallinity and said fully hydrolyzed polyvinyl alcohol resin being moldable and being about 98% hydrolyzed with a melting range between 150°C. and 230° C. which exhibits up to 45% crystallinity.

5. The method of claim 1 wherein said partially hydrolyzed polyvinyl alcohol resin is water soluble and moldable and is about 88% hydrolyzed with a melting range between 120° C. and 200° C. and exhibits up to 24% crystallinity and said fully hydrolyzed polyvinyl alcohol resin is moldable and is about 98% hydrolyzed with a melting range between 150° C. and 230° C. which exhibits up to 45% crystallinity.

6. The method of claim 2 wherein said partially hydrolyzed polyvinyl alcohol resin is water soluble and moldable and is about 88% hydrolyzed with a melting range between 120° C. and 200° C. and exhibits up to 24% crystallinity and said fully hydrolyzed polyvinyl alcohol resin is moldable and is about 98% hydrolyzed with a melting range between 150° C. and 230° C. which exhibits up to 45% crystallinity.

7. The method of claim 3 wherein said partially hydrolyzed polyvinyl alcohol resin is water soluble and moldable and is about 88% hydrolyzed with a melting range between 120° C. and 200° C. and exhibits up to 24% crystallinity and said fully hydrolyzed polyvinyl alcohol resin is moldable and is about 98% hydrolyzed with a melting range between 150° C. and 230° C. which exhibits up to 45% crystallinity.

* * * * *